United States Patent [19]
Naffziger et al.

[11] Patent Number: 5,760,608
[45] Date of Patent: Jun. 2, 1998

[54] HIGH SPEED, LOW CLOCK LOAD REGISTER DUMP CIRCUIT

[75] Inventors: Samuel D. Naffziger, Fort Collins; Ricky L. Pettit, Loveland, both of Colo.

[73] Assignee: Hewlett-Packard Co., Palo Alto, Calif.

[21] Appl. No.: 731,817

[22] Filed: Oct. 21, 1996

[51] Int. Cl.[6] ................................................ H03K 19/0185
[52] U.S. Cl. ............................ 326/86; 326/17; 326/113; 365/189.05
[58] Field of Search .......................... 326/17, 21, 82–83, 326/86, 113, 93, 98; 365/189.05, 189.08

[56] References Cited

U.S. PATENT DOCUMENTS

| | | | |
|---|---|---|---|
| 4,703,457 | 10/1987 | Bodenstab | 365/189.04 |
| 5,255,235 | 10/1993 | Miyatake | 365/189.09 X |
| 5,619,162 | 4/1997 | Ogihara | 326/88 X |
| 5,646,892 | 7/1997 | Masuda et al. | 365/189.05 |
| 5,675,529 | 10/1997 | Poole | 365/189.09 X |

OTHER PUBLICATIONS

"Principles Of CMOS VLSI Design, A Systems Perspective", Neil H.E. Weste, AT&T Bell Laboratories and Kamran Eshraghian, University of Adelaide; Addison-Wesley Publishing Company, Reading, MA; Oct., 1985, pp. 54–58, pp. 161–162.

*Primary Examiner*—David R. Hudspeth
*Attorney, Agent, or Firm*—Jack Lenell

[57] ABSTRACT

A register dump providing enhanced efficiency by using a transmission gate for generating a register word line signal so as to reduce clock loading, and by using a complementary gate for generating a precharged pull-down signal so as to reduce discharge time and register word line capacitive loading.

7 Claims, 5 Drawing Sheets

5,760,608

HIGH SPEED, LOW CLOCK LOAD REGISTER DUMP CIRCUIT

FIELD OF THE INVENTION

The invention relates to register circuits and more particularly to register dump circuits.

BACKGROUND OF THE INVENTION

Various register dump circuits are known in the prior art. FIG. 1 shows a previously know register word line driver circuit. As shown, a clock signal and a register select signal are AND'ed together by an arrangement of N and P channel field effect transistors, so as to provide a rising edge signal output on the register word line when a register coupled thereto is selected. Register dump efficiency is limited in the register word line driver circuit of the prior art because the clock line is always loaded by the circuit, regardless of the state of the register select line. Of course, this limitation is exacerbated in designs having many registers and reports, because the word line driver circuit and its attendant clock load are multiplied throughout the design.

FIG. 2 shows circuits of the prior art for generating precharged pull-down signals for a series of register cells. As shown, each circuit comprises a pair of N-channel field effect transistors connected in series. A word line signal and a data signal are AND'ed together to generate the precharged pull-down signal. Register dump efficiency is limited in the circuit of the prior art. Since the pair of N-channel field effect transistors are connected in series there is a reduced source current for discharging the capacitive load of the register word line, which increases discharge time.

What is needed is an apparatus for enhanced register dump efficiency that provides for generating a register word line signal while reducing clock loading and that provides for generating a precharged pull-down signal while reducing discharge time and register word line capacitive loading.

SUMMARY OF THE INVENTION

The present invention provides enhanced register dump efficiency by using a transmission gate for generating a register word line signal so as to reduce clock loading, and by using a complementary gate for generating a precharged pull-down signal so as to reduce discharge time and register word line capacitive loading.

Briefly and in general terms, the present invention includes a complementary gate having inputs coupled with a data line and a register word line. An input of an amplifier is coupled to an output of the complementary gate. An output of the dump amplifier is coupled with a pre-charged pull down bus.

The invention further includes a transmission gate having inputs coupled with a register select line and a clock line, and having an output coupled with the register word line. The transmission gate advantageously presents a full capacitive load to the clock line only when the register is selected. In register file designs, for a given port only one register is selected at a time.

Other aspects and advantages of the present invention will become apparent from the following detailed description, taken in conjunction with the accompanying drawings, illustrating by way of example the principles of the invention.

DETAILED DESCRIPTION OF THE PREFERRED EMBODIMENT

Figure 1:
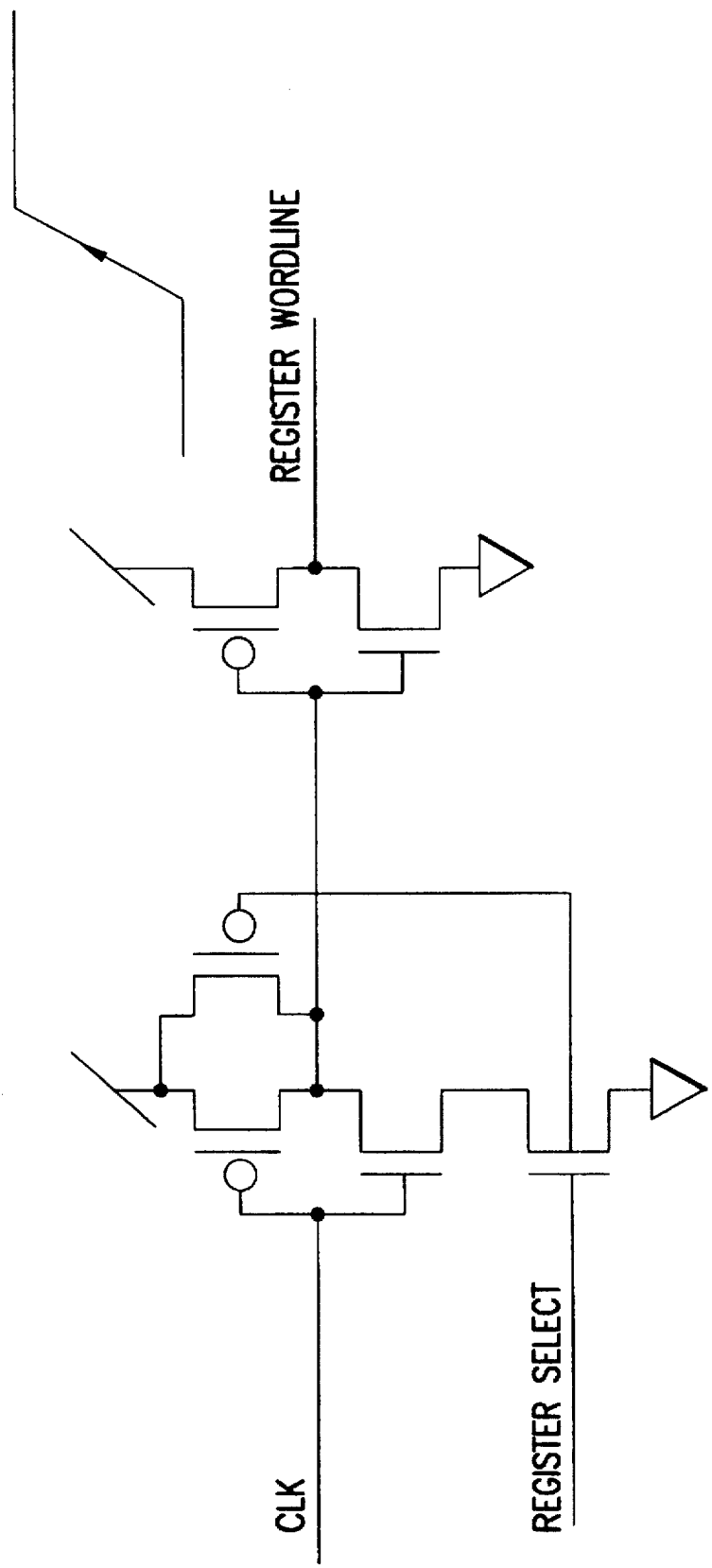
FIG. 1 shows a previously know register word line driver circuit.
Figure 2:
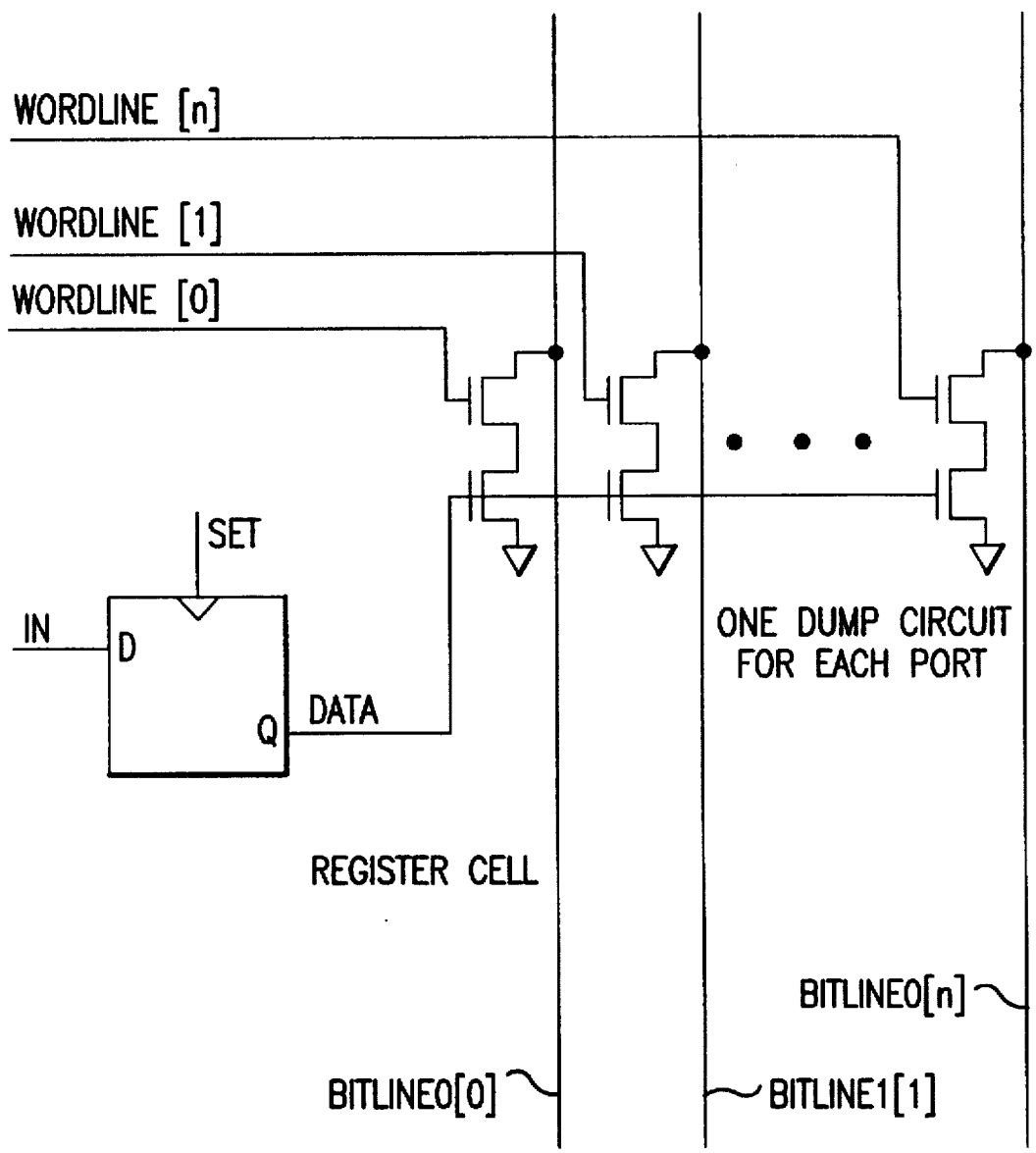
FIG. 2 shows circuits of the prior art for generating precharged pull-down signals for a series of register cells.
Figure 3:
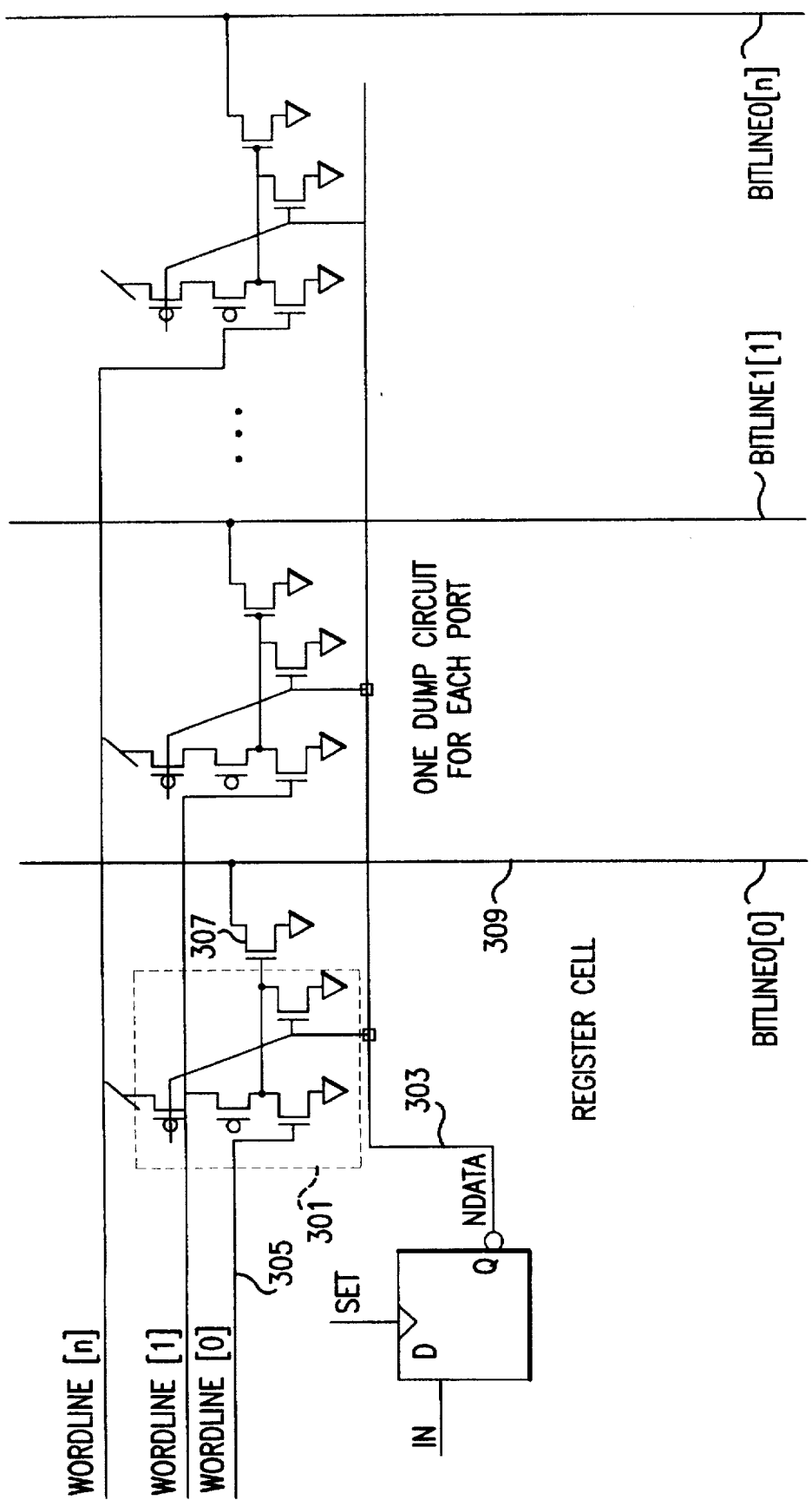
FIG. 3 is a detailed schematic showing circuits in accordance with the principles of the invention.

The present invention provides enhanced register dump efficiency by using a complementary gate for generating a precharged pull-down signal so as to reduce discharge time and register word line capacitive loading. FIG. 3 is a detailed schematic showing circuits for generating precharged pull-down signals for a series of register cells, in accordance with the principles of the invention. As shown, each circuit comprises the complementary gate 301 having inputs coupled with the data line 303 and the register word line 305, so as to provide a NOR gate. An amplifier 307 has an input coupled with an output of the complementary gate. An output of the amplifier is coupled with the pre-charged pull down bus 309.

As shown in FIG. 3, the amplifier 307 includes an N-channel field effect transistor having a gate coupled with the output of the NOR gate, having a source coupled with ground, and having a drain coupled with pre-charged pull down bus. The use of N-channel field effect transistor advantageously provides for high speed operation of the circuit.

Figure 4:
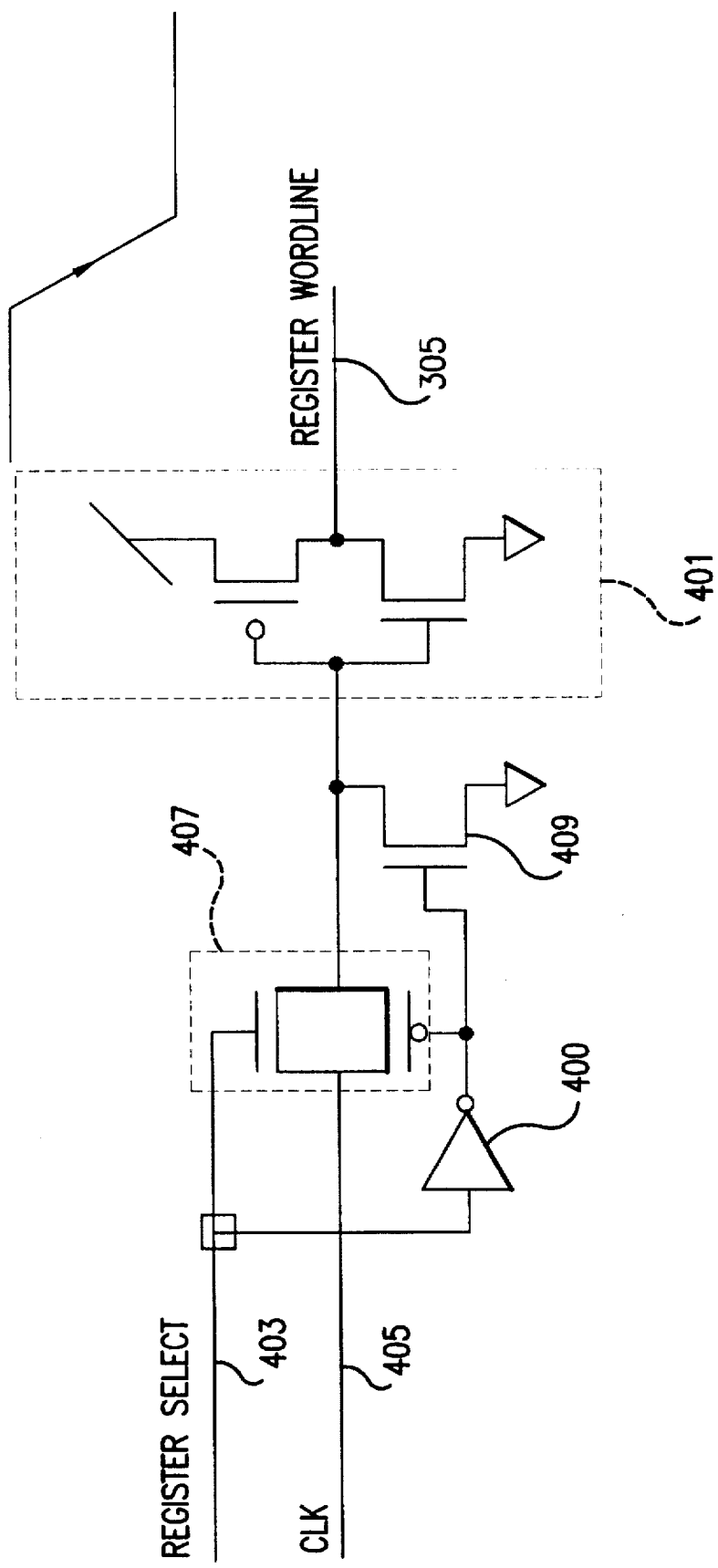
FIG. 4 is another detailed schematic, which shows a register word line driver circuit in accordance with the principles of the invention.

FIG. 4 is another detailed schematic, which shows a register word line driver circuit in accordance with the principles of the invention. A first inverter 400 has an input coupled with the register select line 403. A second inverter 401 has an output coupled with the register word line 305.

As shown, a transmission gate 402 has a control input coupled with a register select line 403, has a gate input coupled with a clock line 405, and has a gate output coupled with the register word line 305. The second inverter 401 is coupled between the gate output of the transmission gate and the register word line, so that the transmission gate and the inverter function together as a NAND gate. Accordingly, a clock signal and a register select signal are NAND'ed together to provide a falling edge signal output on the register word line when a register coupled thereto is selected.

As shown, the transmission gate 407 includes an arrangement of an N-channel field effect transistor and a P-channel field effect transistor each having their respective sources coupled with the clock line 405 and each having their respective drains coupled with the input of the second inverter 401. The N-channel field effect transistor has a gate coupled with the register select line. The P-channel field effect transistor has a gate coupled with the output of the first inverter.

An amplifier 409 has an input coupled with the register select line, and has an output coupled with the register word line. The amplifier includes an N-channel field effect transistor, which has a gate coupled with the output of the first inverter, a drain coupled with the input to the second inverter, and a source coupled with ground.

Figure 5:
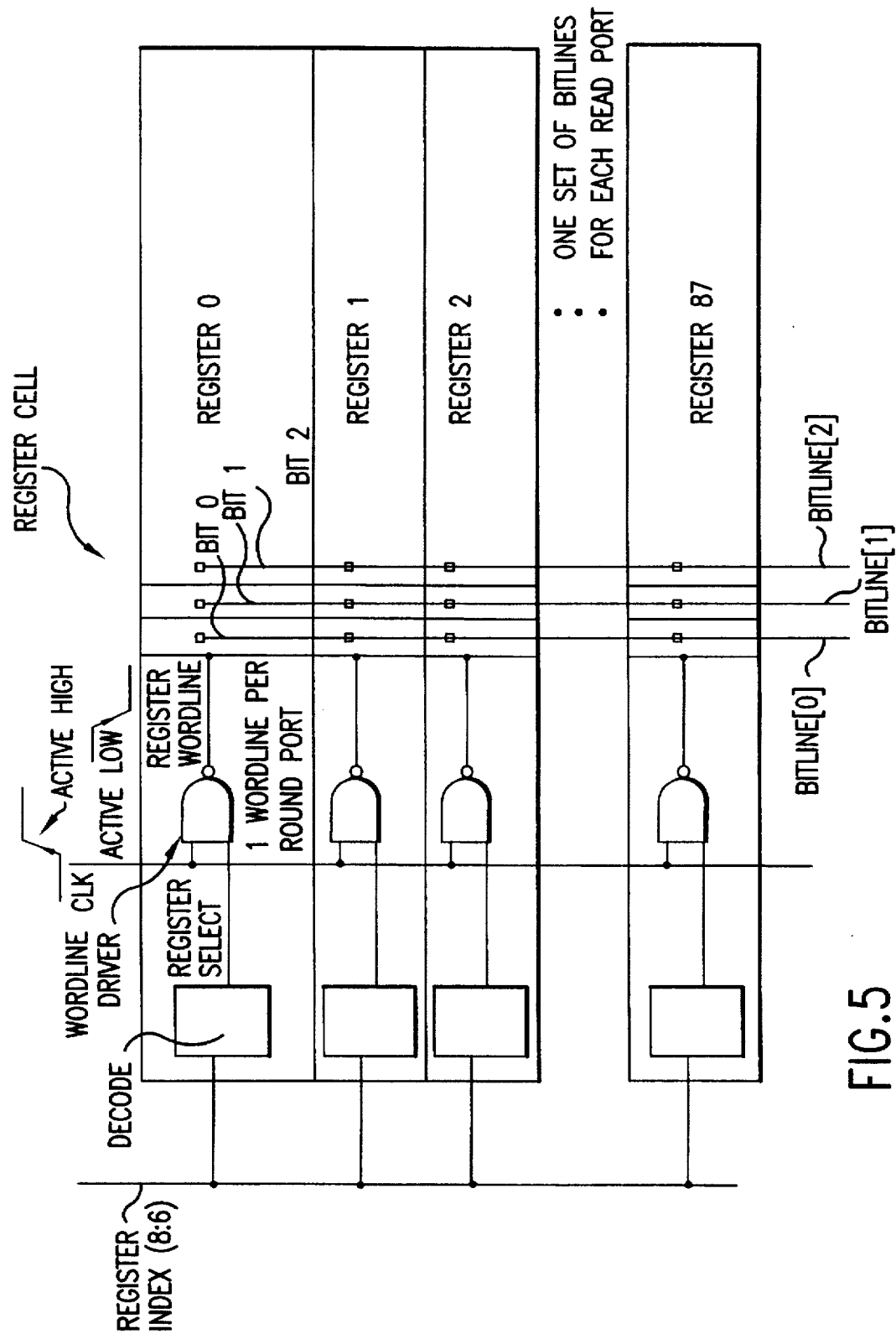
FIG. 5 is a schematic showing a NAND gate of FIG. 4 coupled with the register cells of FIG. 3.

FIG. 5 is a schematic showing the NAND gate of FIG. 4 coupled with the register cells of FIG. 3. In designs having many registers as shown in FIG. 5, the benefits of the invention are multiplied many times.

The present invention provides enhanced register dump efficiency by using a transmission gate for generating the register word line signal, and by using a complementary gate for generating the precharged pull-down signal. Although specific embodiments of the invention have been described and illustrated, the invention is not to be limited to the specific forms or arrangements of parts so described and illustrated, and various modifications and changes can be made without departing from the scope and spirit of the invention. Within the scope of the appended claims, therefore, the invention may be practiced otherwise than as specifically described and illustrated.

What is claimed is:

1. An apparatus comprising:

a data line;

a register word line;

a pre-charged pull down bus;

a complementary gate having inputs coupled with the data line and the register word line and having an output; and an amplifier having an input coupled with the output of the complementary gate and having an output coupled with the pre-charged pull down bus.

2. An apparatus as in claim 1 wherein the complementary gate includes a NOR gate having inputs coupled with the data line and the register word line and having an output coupled with the amplifier.

3. An apparatus as in claim 2 wherein the amplifier includes an N-channel field effect transistor having a gate coupled with the output of the NOR gate, having a source coupled with ground, and having a drain coupled with pre-charged pull down bus.

4. An apparatus comprising:

a register select line;

a clock line;

a register word line;

a transmission gate having a control input coupled with the register select line, having a gate input coupled with the clock line and having a gate output coupled with the register word line; and an amplifier having an input coupled with the register select line, and having an output coupled with the register word line.

5. An apparatus as in claim 4 further comprising an inverter coupled between the gate output of the transmission gate and the register word line, so that the transmission gate and the inverter function together as a NAND gate.

6. An apparatus as in claim 4 wherein:

the apparatus further comprises:

a first inverter having an input coupled with the register select line and having an output;

a second inverter having an output coupled with the register word line and having an input;

the transmission gate includes:

an arrangement of an N-channel field effect transistor and a P-channel field effect transistor each having their respective sources coupled with the clock line and each having their respective drains coupled with the input of the second inverter, wherein the N-channel field effect transistor has a gate coupled with the register select line, and the P-channel field effect transistor has a gate coupled with the output of the first inverter; and the amplifier includes an N-channel field effect transistor, which has a gate coupled with the output of the first inverter, a drain coupled with the input to the second inverter, and a source coupled with ground.

7. An apparatus comprising:

a data line;

a register word line;

a pre-charged pull down bus;

a register select line;

a clock line;

a transmission gate having inputs coupled with the register select line and the clock line and having an output coupled with the register word line;

a complementary gate having inputs coupled with the data line and the register word line and having an output; and an amplifier having an input coupled with the output of the complementary gate and having an output coupled with the pre-charged pull down bus.

* * * * *